(12) United States Patent
Sako et al.

(10) Patent No.: US 6,724,503 B1
(45) Date of Patent: Apr. 20, 2004

(54) IMAGE SENSOR SUBSTRATE AND IMAGE SENSOR EMPLOYING IT

(75) Inventors: Teruhisa Sako, Kyoto (JP); Hiroaki Hayashi, Kyoto (JP); Eiji Yokoyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/486,295

(22) PCT Filed: Aug. 31, 1998

(86) PCT No.: PCT/JP98/03905

§ 371 (c)(1),
(2), (4) Date: Feb. 22, 2000

(87) PCT Pub. No.: WO99/12338

PCT Pub. Date: Mar. 11, 1999

(30) Foreign Application Priority Data

Aug. 29, 1997 (JP) .............................................. 9/234378

(51) Int. Cl.[7] ................................................. H04N 1/04
(52) U.S. Cl. ....................... 358/483; 358/475; 358/482; 250/208.1
(58) Field of Search ................................ 358/483, 482, 358/497, 496, 514, 512, 513, 475, 509, 484, 474, 505, 473; 382/312, 313, 214.1; 250/208.1; 348/241, 221.1, 250; 257/433, 435, 703

(56) References Cited

U.S. PATENT DOCUMENTS 5,569,390 A * 10/1996 Endo ........................ 250/208.1
6,169,317 B1 * 1/2001 Sawada et al. ............. 357/435
6,343,162 B1 * 1/2002 Saito et al. ................. 382/312

FOREIGN PATENT DOCUMENTS

| JP | 63-165976 | 11/1988 |
| JP | 63-288560 | 11/1988 |
| JP | 64-5062 | 1/1989 |
| JP | 64-65522 | 3/1989 |
| JP | 4-061546 | 2/1992 |
| JP | 5-335539 | 12/1993 |

* cited by examiner

Primary Examiner—Cheukfan Lee
(74) Attorney, Agent, or Firm—Merchant & Gould P.C.

(57) ABSTRACT

An image sensor according to the present invention includes a casing (4), a light source disposed in the casing (4) for emitting light toward an object (K) to be read, and an image sensor board (6) provided, on an obverse surface thereof, with a plurality of light receiving elements (52) for generating image signals upon receiving light reflected by the object (K). The image sensor board (6) is disposed so that the obverse surface thereof is directed inwardly of the casing (4). The substrate (6) is provided with a light shielding layer (61) for covering the reverse surface of the substrate at least entirely over a portion of the obverse surface where the plurality of light receiving elements (52) are mounted, so that disturbing external light is prevented from entering inside the casing (4).

15 Claims, 12 Drawing Sheets

IMAGE SENSOR SUBSTRATE AND IMAGE SENSOR EMPLOYING IT

TECHNICAL FIELD

The present invention relates to an image sensor board as a component for various kinds of image sensors such as a flat-bed type image sensor. Further, the present invention relates to an image sensor incorporating such an image sensor board.

BACKGROUND ART

Figure 14:
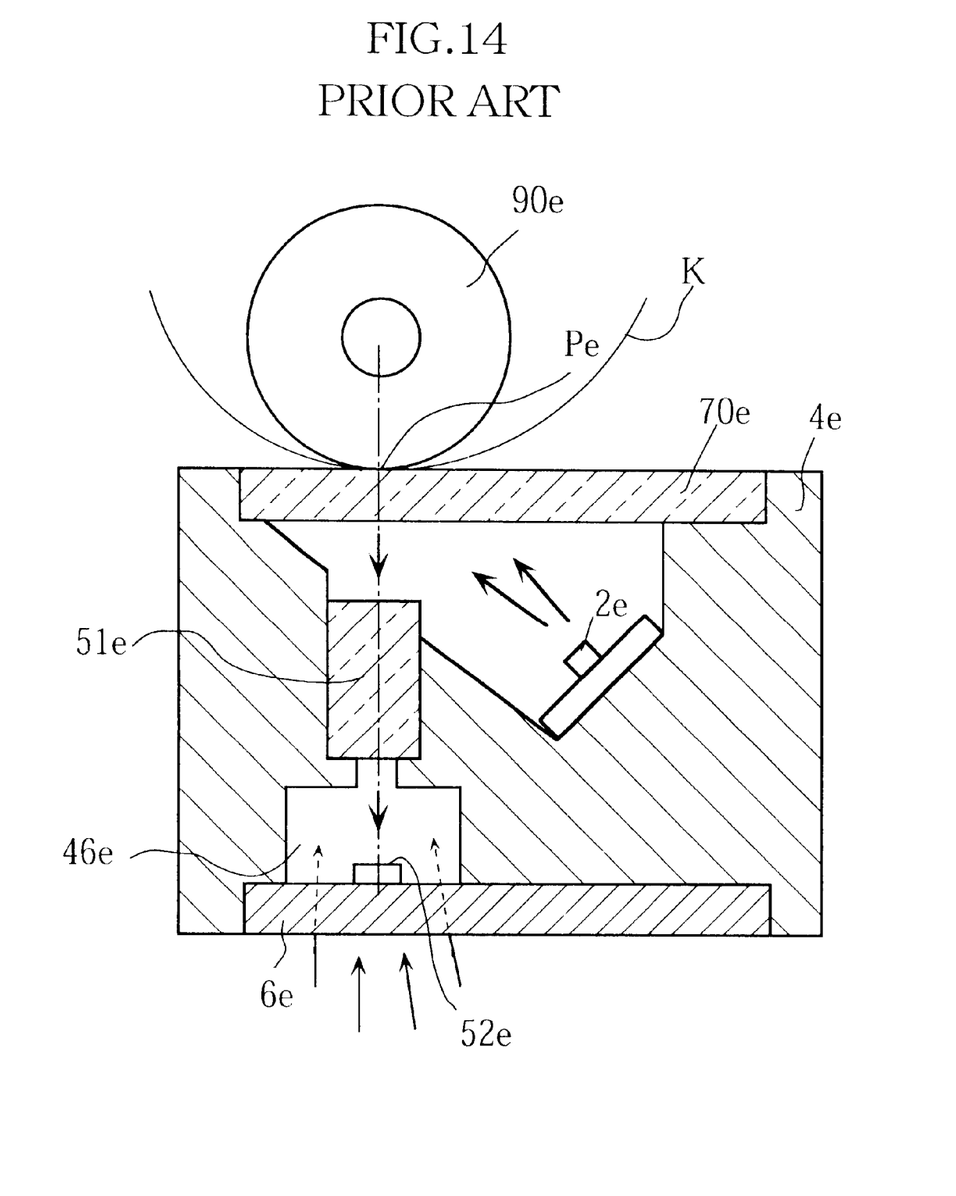
FIG. 14 illustrates an example of prior-art image sensor.

A typical prior art contact-type image sensor has a structure shown in FIG. 14. The illustrated image sensor comprises a light source 2e, a casing 4e for accommodating the light source 2e, an image sensor board 6e mounted at the bottom of the casing 4e, a document supporting panel 70e mounted in an upper portion of the casing 4e, a focus lens unit 51e disposed between the document supporting panel 70e and the image sensor board 6e and a platen 90e for transmitting a document K held in contact with the document supporting panel 70e. The image sensor board 6e is provided with a plurality of light receiving elements 52e disposed in an array extending in the primary scanning direction. The document supporting panel 70e is made of a transparent glass material and is held in contact with the platen 90e at a portion, which serves as an image-reading line P.

In reading an image of the document, the light source 2e emits light toward the image-reading line P while the platen 90e transmits the document K in the secondary scanning direction. The light reflected by the document K is focused on the array of light receiving elements 52e by the focus lens unit 51e. As a result, each of the light receiving elements 52e generates an image signal corresponding to the received amount of light. The image sensor board 6e may be, for example, a white plate made of a ceramic material. The image sensor board is disposed so as to close a bottom opening of the casing 4e so that disturbing external light is prevented from entering the inner space 46e located below the focus lens 51e.

However, with such a conventional image sensor, depending on the conditions of the use, noises are included in reading out the image of the document, which leads to degradation of the quality of the obtained image. The inventors have experimentally found the following to be one cause.

The image sensor board 6e, though having a white surface, does not reflect all the received light, but allows a certain amount of light to pass through the image sensor board. Accordingly, if another light source exists outside the casing 4e, a certain amount of light (including visible rays as well as ultraviolet rays and infrared rays) emitted from such an outer light source passes through the image sensor board 6e to enter the inner space 46e of the casing 4e.

On the other hand, the light receiving element 52e, which may be a phototransistor capable of photoelectric conversion, generates a signal upon receiving visible rays as well as ultraviolet rays and infrared rays. Thus, in the prior art, the light entering the inner space 46 through the image sensor board 6e is unfavorably detected by the light receiving element 52e, which generates an improper signal, thereby causing noises.

This problem occurs even when the image sensor board 6e is made of a synthetic resin such as glass-fiber-reinforced epoxy resin instead of a ceramic material.

DISCLOSURE OF THE INVENTION

It is, therefore, an object of the present invention to prevent disturbing external light from passing through an image sensor board to be received by light receiving elements, thereby enhancing the image reading quality provided by an image sensor.

In accordance with a first aspect of the present invention, there is provided an image sensor board comprising a substrate having an obverse surface provided with a plurality of light receiving elements for generating image signals upon receiving light, and a light shielding layer for covering a reverse surface of the substrate at least entirely over a portion of the obverse surface where the plurality of light receiving elements are mounted.

According to a preferred embodiment of the present invention, the light shielding layer may be black. Specifically, it is advantageous that the shielding layer comprises a black glass material containing a first Fe—Cr—Co based black pigment and a second Cu—Cr based black pigment in a total amount of 13–25 wt %.

The light shielding layer may cover the entire reverse surface of the substrate. Moreover, the light shielding layer may further extend beyond the substrate.

According to another preferred embodiment of the present invention, the light shielding layer may comprise a light-shielding tape bonded to the reverse surface of the substrate.

According to still another preferred embodiment of the present invention, the light shielding layer may be formed by applying, to the reverse surface of the substrate, a coating material containing a black pigment.

In accordance with a second aspect of the present invention, there is provided an image sensor comprising: a casing; a light source disposed in the casing for emitting light toward an object to be read; an image sensor board having on an obverse surface provided with a plurality of light receiving elements for generating image signals upon receiving light reflected by the object, the image sensor board being disposed so that the obverse surface thereof directed inwardly of the casing; wherein the substrate is covered with a light shielding layer for covering a reverse surface of the substrate at least entirely over a portion of the obverse surface where the plurality of light receiving elements are mounted.

BEST MODE FOR CARRYING OUT THE INVENTION

The preferred embodiments of the present invention will be described below in detail with reference to the accompanying drawings.

Figure 1:
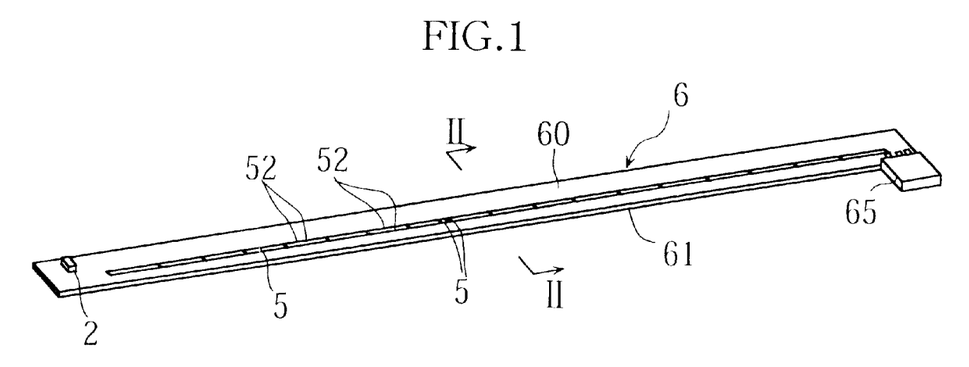
FIG. 1 is a perspective view showing an example of image sensor board embodying the present invention.
Figure 2:
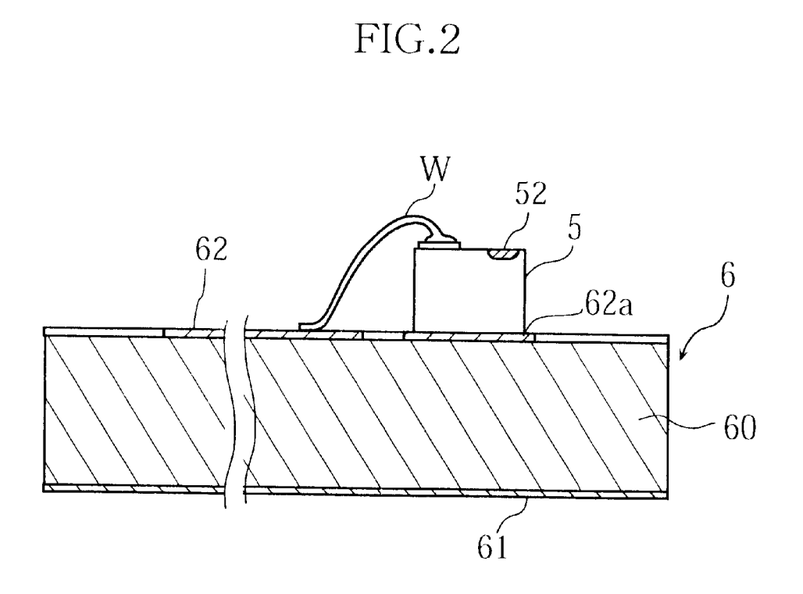
FIG. 2 is an enlarged sectional view taken along lines II—II in FIG. 1.

Referring to FIGS. 1 and 2, an image sensor board 6 in accordance with a preferred embodiment of the present invention includes, as a main component, a substrate 60 formed of a ceramic material mainly composed of alumina. The substrate 60 maybe in the form of a strip. The obverse surface of the substrate 60 is provided with a conductor pattern 62 on which a plurality of image sensor chips 5 and a light source 2 are mounted. Almost the entirety of the reverse surface of the substrate 60 is covered with a light shielding layer 61.

In the illustrated embodiment, the plurality of image sensor chips 5 are arranged in an array extending longitudinally of the substrate 60. Each of the image sensor chips 5 is a semiconductor device having a plurality of integrally built-in light receiving elements 52. Upon receiving light, the image sensor chip generates a signal (an image signal) with an output level corresponding to the received amount of light. Each of the image sensor chips 5 is bonded onto a corresponding pad 62a of the conductor pattern 62 on the substrate 60, and is connected to an appropriate portion of the conductor pattern 62 via a wire W such as a gold wire.

In the illustrated embodiment, the light source 2 is a resin-packaged unit including three kinds of LED chips respectively emitting red, green and blue light. The light source 2 is bonded onto the conductor pattern 62 on the substrate 60 at an end thereof. On the other end of the substrate 60 is mounted a connector 65. The connector 65 is electrically connected to the light source 2 or the image sensor chips 5 via the conductor pattern 62, and is also electrically connected to an external control device (not shown) via a cable (not shown). It should be noted that where the image sensor board 6 is used to read a monochromatic image, it is sufficient to employ a light source 2 which emits monochromatic light only.

The light shielding layer 61 may be made of a black glass material. The light shielding layer is obtained by applying a glass paste material containing two kinds of black pigments onto the reverse surface of the substrate 60, and thereafter baking the material. The two kinds of pigments may be a first Fe—Cr—Co based black pigment and a second Cu—Cr based black pigment.

The proportion of the first black pigment to the second black pigment may be, for example, about 5:4 by weight. The total content of the first and the second black pigments in the light shielding layer 61 may be e.g. 13–25 wt %. The wall thickness of the light shielding layer 61 may be about 8–20 μm.

Although the substrate 60 is inherently white, the reverse surface thereof is made black by the provision of the light shielding layer 61. The first Fe—Cr—Co based black pigment contained in the shielding layer 61 mainly blocks ultraviolet rays and visible rays, whereas the second Cu—Cr based black pigment mainly blocks infrared rays of a longer wavelength than that of visible rays. Accordingly, the light shielding layer 61 blocks a wide range of light including ultraviolet rays, visible rays and infrared rays.

Figure 3:
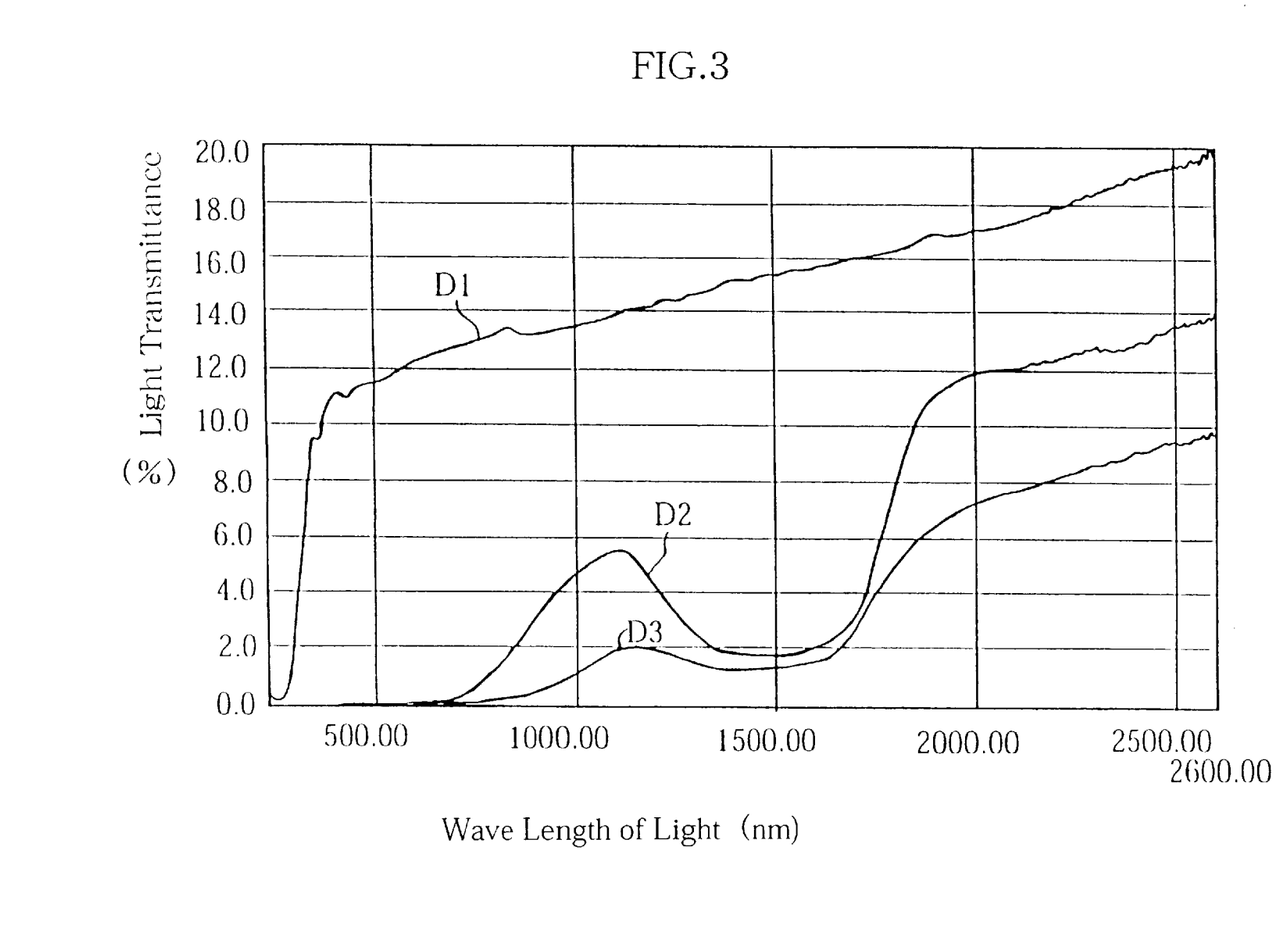
FIG. 3 is a graph showing the relationship between the wavelength of light irradiating the image sensor board and the light transmittance.

FIG. 3 is a graph showing the relationship between the wavelength of the light irradiating the image sensor board and the light transmittance. The data shown in the graph was obtained by an experiment which is performed on the condition that other conditions such as the thickness of the substrate are rendered the same.

In FIG. 3, the curve D1 shows the light transmittance of a substrate 60 which is not provided with a light shielding layer on the reverse surface thereof. As is clear from the curve D1, the light transmittance is high in any region including the visible region (330 nm–770 nm), the ultraviolet region and the infrared region. Accordingly, when the reverse surface of the substrate 60 which is not provided with a light shielding layer is irradiated with light, a comparatively large amount of light passes through the substrate toward the obverse surface thereof.

The curve D2 in FIG. 3 shows the light transmittance of a substrate 60 provided, on the reverse surface thereof, with a light shielding layer containing only a first Fe—Cr—Co based black pigment. As is clear from the curve D2, the light transmittance of the substrate 60 provided with the shielding layer containing the first black pigment is lower than that of the substrate without a light shielding layer (curve D1) in any wavelength region, but particularly in the visible region and the ultraviolet region.

The curve D3 in FIG. 3 shows the light transmittance of a substrate 60 provided, on the reverse surface thereof, with a light shielding layer 61 containing a first Fe—Cr—Co based black pigment and a second Cu—Cr based black pigment. As is clear from the curve D3, the light transmittance of the substrate 60 provided with the shielding layer 61 containing the first and the second black pigments is lower than that of the substrate provided with the shielding layer containing only the first black pigment (curve D2) in any wavelength region, but particularly in the infrared region.

As can be understood from the graph of FIG. 3, the image sensor board 6 of this embodiment is capable of decreasing the light transmittance in various regions of wavelength. Further, the inventors have experimentally found that such a light blocking property in various regions of wavelength is reliably obtained by the light shielding layer 61 which contains the first black pigment and the second black pigment in the proportion of about 5:4 by weight, the total content of the two kinds of black pigments in the glass material being more than 13 wt %, and which has a thickness of no less than 8 μm. The inventors have also experimentally found that when the total content of the first and the second black pigments in the light shielding layer 61 exceeds 25 wt %, these pigments themselves agglomerate so that the adhesion of the glass paste material to the substrate 60 drastically decreases. According to the present embodiment, however, the total content of the two kinds of black pigments in the light shielding layer 61 is rendered no more than 25 wt %. Accordingly, the light shielding layer 61 enjoys good adhesion to the substrate 60, and therefore, is less likely to come off from the reverse surface of the substrate 60.

Now, an example of image sensor employing the above described image sensor board 6 will be described with reference to FIGS. 4 to 10.

As shown in FIGS. 4 through 7, an image sensor indicated by reference character A includes, in addition to the image sensor board 6, a casing 4, a focus lens 51, a light guide 1, a first reflector 3A, a second reflector 3B and at least one attachment 69. The illustrated image sensor is of a flat-bed type, and further includes a document supporting panel 70 made of a transparent glass material for placing a document K thereon (see FIGS. 4 to 6).

Figure 4:
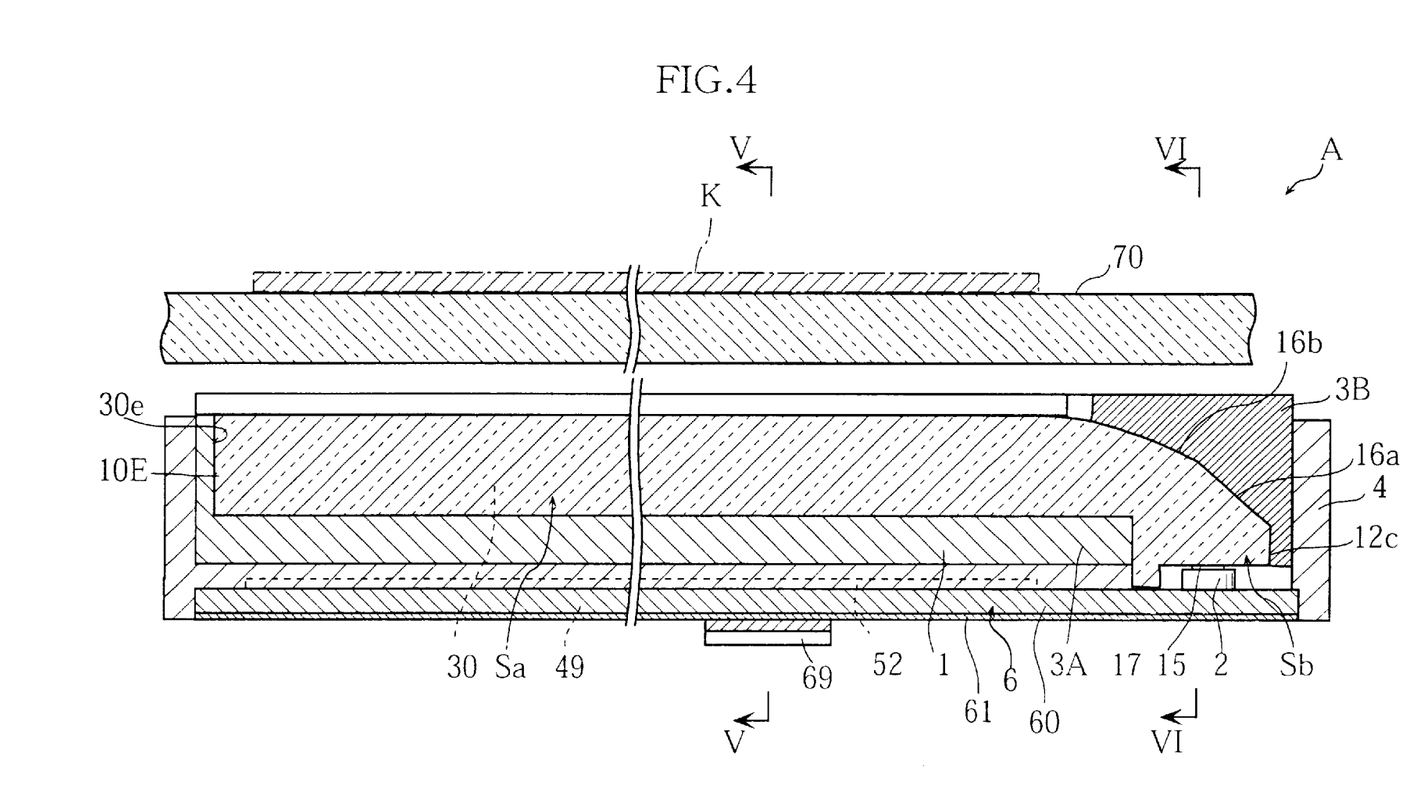
FIG. 4 is a sectional view, partially cut away, showing an example of image sensor embodying the present invention.

The casing 4 may be formed of e.g. a black synthetic resin and has an elongated box-like configuration which is upwardly and downwardly open. The components of the image sensor 4 described above are accommodated in the casing 4. The casing 4 is movable, under and in facing relation to the document supporting panel 70, in the secondary scanning direction (perpendicular to the primary scanning direction in which the array of the image sensor chips 5 extends). The upper surface of the document supporting panel 70 provides, at the portion located directly above the focus lens 51, an image-reading line P, which moves progressively with the movement of the casing 4. Since the means for moving the casing 4 conventional, the description thereof will be omitted.

The image sensor board 6 is accommodated in a recess 49 which provides the bottom opening of the casing 4. The shielding layer 61 of the image sensor board 6 is oriented downward (outward). The light source 2 and the plurality of light receiving elements 52 are disposed in the inner spaces 45, 46 of the casing 4, respectively (see FIGS. 5 and 6).

The attachment 69 is provided to fix the image sensor board 6 to the casing 4. The attachment is fitted over the casing 4 from below to engage outward protrusions 48 provided on both sides of the casing 4. Thus, the image sensor board 6 is prevented from being removed downwardly. The attachment 69 may be prepared by press-working a thin metal plate and may have an appropriate resiliency.

Figure 8:
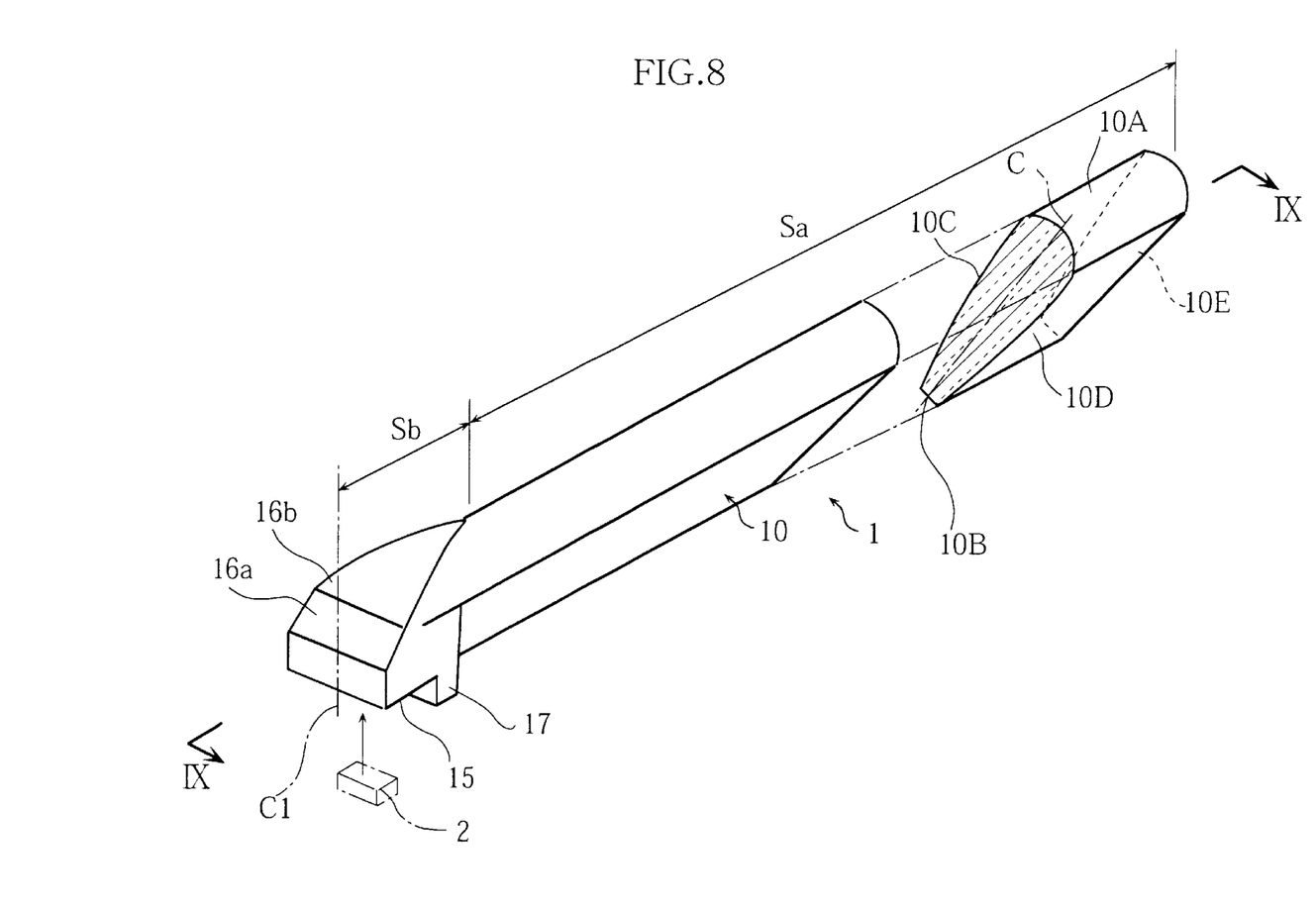
FIG. 8 is a schematic perspective view, partially shown in section, of the light guide used in the image sensor shown in FIG. 4.

The light guide 1 guides light emitted from the light source 2 on the image sensor board 6 to the image-reading line P for irradiating the image-reading line in the form of a line or band extending in the primary scanning direction. As shown in FIG. 8, the light guide 1 may be provided with a transparent member 10 made of e.g. a transparent acrylic material such as PMMA (polymethyl methacrylate) and may have a mirror surface. When the transparent member 10 has a mirror surface, light propagating inside the transparent member is incident to the mirror surface at an angle greater than the critical angle (which is determined depending on the material of the transparent member) will be totally reflected. On the other hand, when the internally propagating light is incident to the mirror surface at an angle smaller than the critical angle, the light is allowed to go out of the transparent member. The mirror surface may not be necessarily prepared by positive polishing. The mirror surface used herein may include, for example, a relatively smooth surface of a transparent member simply formed by resin-molding.

The light guide 1 is divided into a primary section Sa having a generally uniform cross section and an auxiliary section Sb connected to an end of the primary section Sa. The auxiliary section Sb functions to guide light emitted from the light source 2 to the primary section Sa. On the other hand, the primary section Sa functions to direct the light from the auxiliary section Sb to the outside while propagating it longitudinally inside the primary section.

The auxiliary section Sb includes a light-incident portion 15 which is downwardly planar, a downward projection 17 provided at one side of the light-incident portion 15, and inclined surfaces 16a, 16b provided in facing relation to the light-incident portion 15. In placing the light guide 1 above the image sensor board 6, the tip of the projection 17 is brought into abutment against a surface of the image sensor board 6, thereby positioning the entire light guide 1. The light-incident portion 15 receives light from the light source 2. The inclined surfaces 16a, 16b reflect the light entering the auxiliary section Sb through the light-incident portion 15 into the primary section Sa. In this embodiment, the inclined surface 16a is planar, whereas the inclined surface 16b is slightly curved. Each oblique angle of the inclined surfaces 16a, 16b is set so that the light from the light-incident portion 15 is totally reflected.

The primary section Sa includes a first longitudinal surface 10A, a second longitudinal surface 10B, a third longitudinal surface 10C, a fourth longitudinal surface 10D and an end surface 10E. The first longitudinal surface 10A and the second longitudinal surface 10B are provided in facing relation to each other, whereas the third longitudinal surface 11C and the fourth longitudinal surface 10D are provided in facing relation to each other. The second longitudinal surface 10B is smaller in width than the first longitudinal surface 10A.

Figure 10:
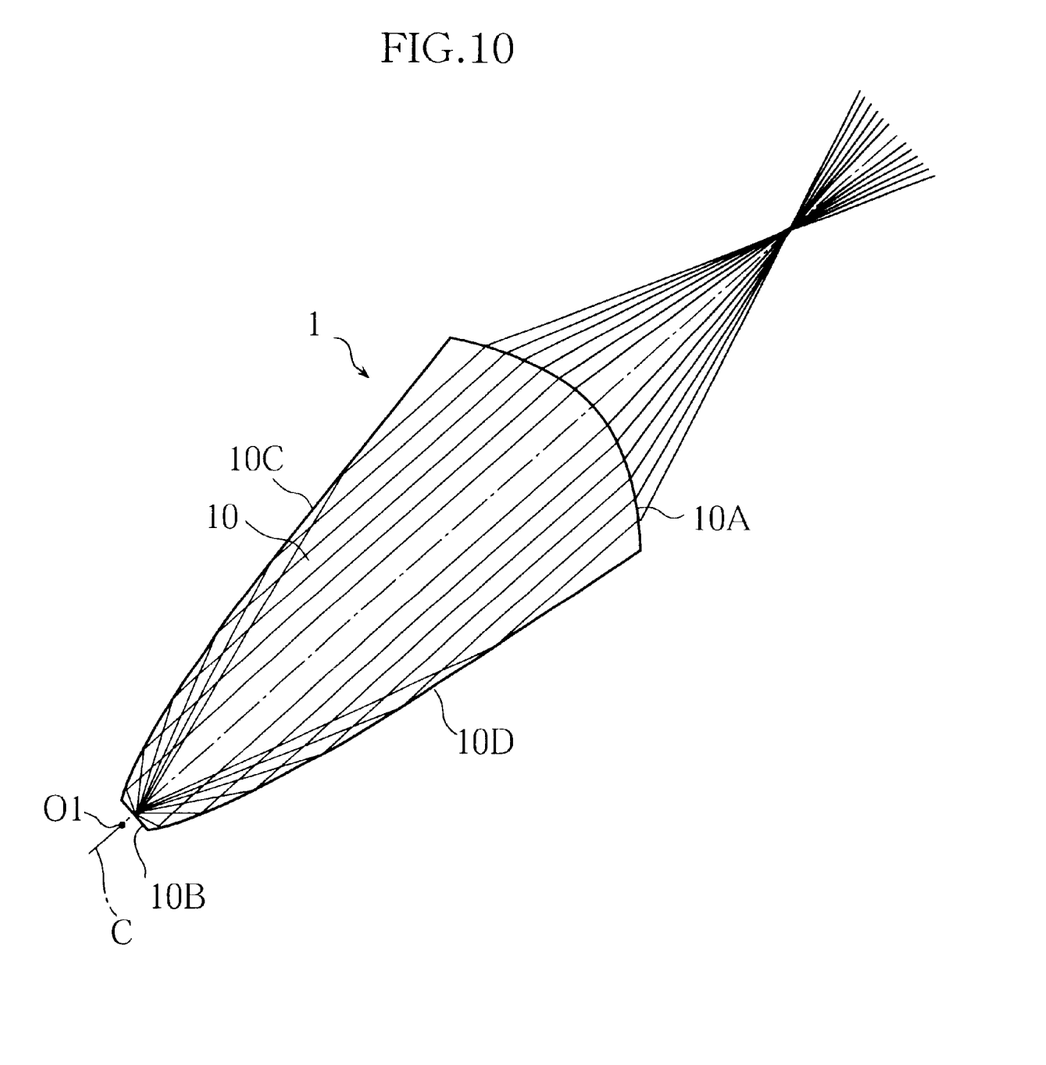
FIG. 10 illustrates the function of the light guide shown in FIG. 8.

Almost the entire portion of the first longitudinal surface 10A serves as a light-emitting surface. The first longitudinal surface has a non-spherical convex configuration with a projecting widthwise central portion. As shown in FIG. 10, the third longitudinal surface 10C and the fourth longitudinal surface 10D are parabolic surfaces (secondary surfaces) which are symmetrical with respect to a main axis C of the primary section Sa of the transparent member 10. The main axis C is inclined relative to a center line C1 of the auxiliary section Sb (See FIG. 8). As will be described later, this is because the auxiliary section Sb needs to be so oriented that the light-incident portion 15 faces the light source 2, whereas the primary section Sa needs to be so oriented that the first longitudinal surface 10A faces toward the image-reading line P.

Figure 9:
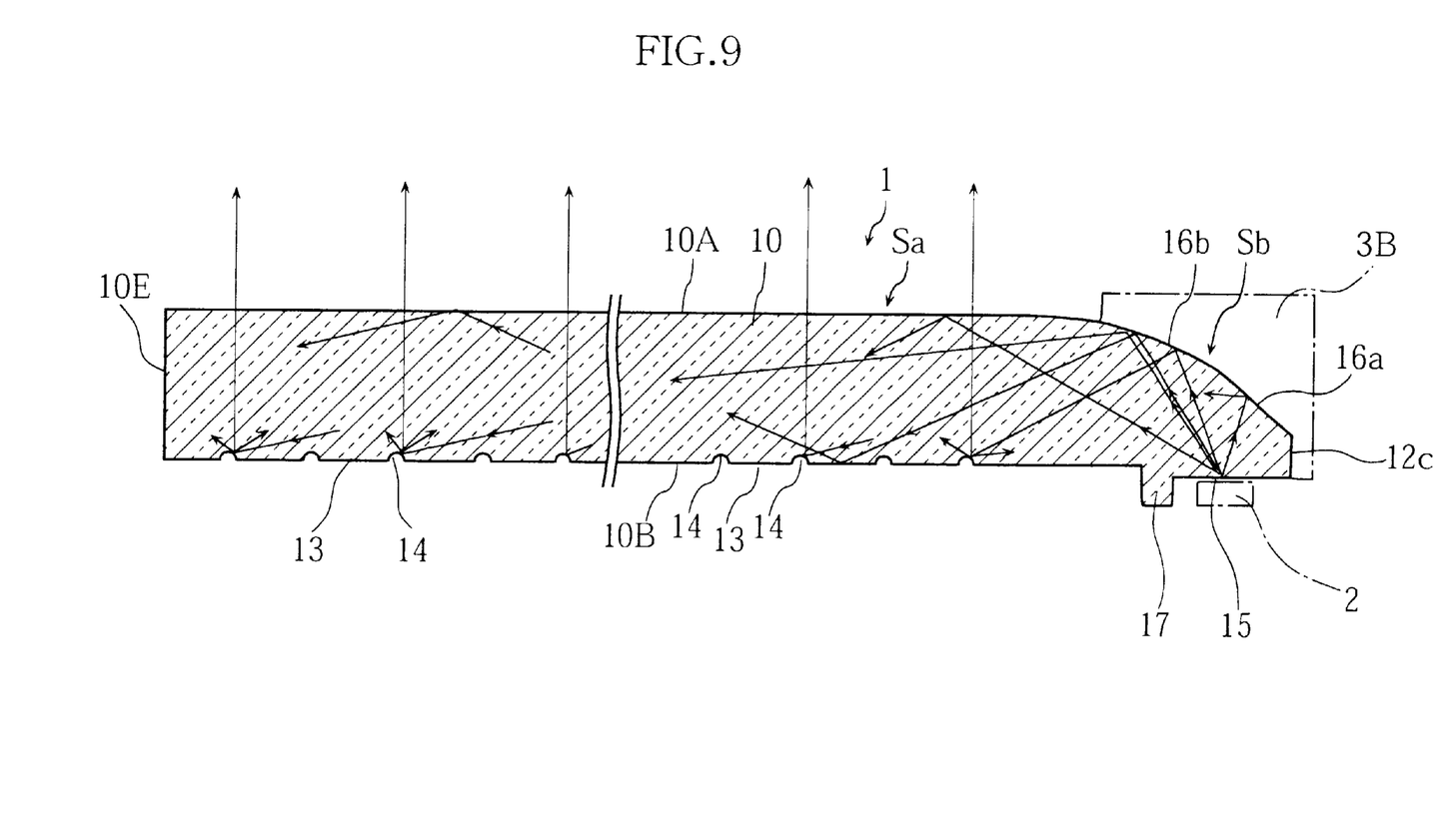
FIG. 9 is a sectional view taken along lines IX—IX in FIG. 8.

As clearly shown in FIG. 10, the second longitudinal surface 10B extends adjacent a common focus O1 parabolically defined by the third longitudinal surface 10C and the fourth longitudinal surface 10D. Further, as shown in FIG. 9, the second longitudinal surface 10B is formed with a plurality of grooves 14 with suitable intervals. The surface portions 13 between the respective grooves 14 are planar to work as a mirror surface. Each of the plural grooves 14 functions is cross-sectionally arcuate for example for steeply changing the light propagating direction within the light guide 1 to direct the light to the outside through the first longitudinal surface 10A. Other means may be adopted to steeply change the light propagating direction. For example, the second longitudinal surface 10B may be provided with a plurality of protrusions at suitable intervals, or a light-scattering reflective material maybe applied to the second longitudinal surface 10B, or the second longitudinal surface 10B may be roughened.

The light guide 1 allows the light entering through the light-incident portion 15 to be emitted through the longitudinal surface 10A over the entire length thereof. Specifically, as shown in FIG. 9, the light emitted from the light source 2 disposed in facing relation to the light-incident portion 15 spreads suitably upon entering the light guide 1. Most of the entering light is then reflected by the inclined surfaces 16a, 16b to advance longitudinally into the primary section Sa. The advancing light is repetitively subjected to total reflection on the first longitudinal surface 10A, the third longitudinal surface 10C, the fourth longitudinal surface 10D and the planar portions 13 of the second longitudinal surface 10B before reaching the end surface 10E located at a longitudinal end of the light guide 1. On the other hand, most of the light reaching each groove 14 of the second longitudinal surface 10B changes its propagating direction steeply. As a result, as shown in FIG. 10, much light reaching the second longitudinal surface 10B travels toward the third longitudinal surface 10C and the fourth longitudinal surface 10D to be totally reflected thereon. Since the third longitudinal surface 10C and the fourth longitudinal surface 10D are parabolic with the second longitudinal surface 10B located adjacent the focus O1 of the parabola, the light thus reflected by the third longitudinal surface 10C and the fourth longitudinal surface 10D propagates toward the first longitudinal surface 10A as a bundle of light rays which are substantially parallel to the main axis of the parabola. As a result, the first longitudinal surface 10A provides a convex lens function to collect the light rays at its focal point.

Figure 5:
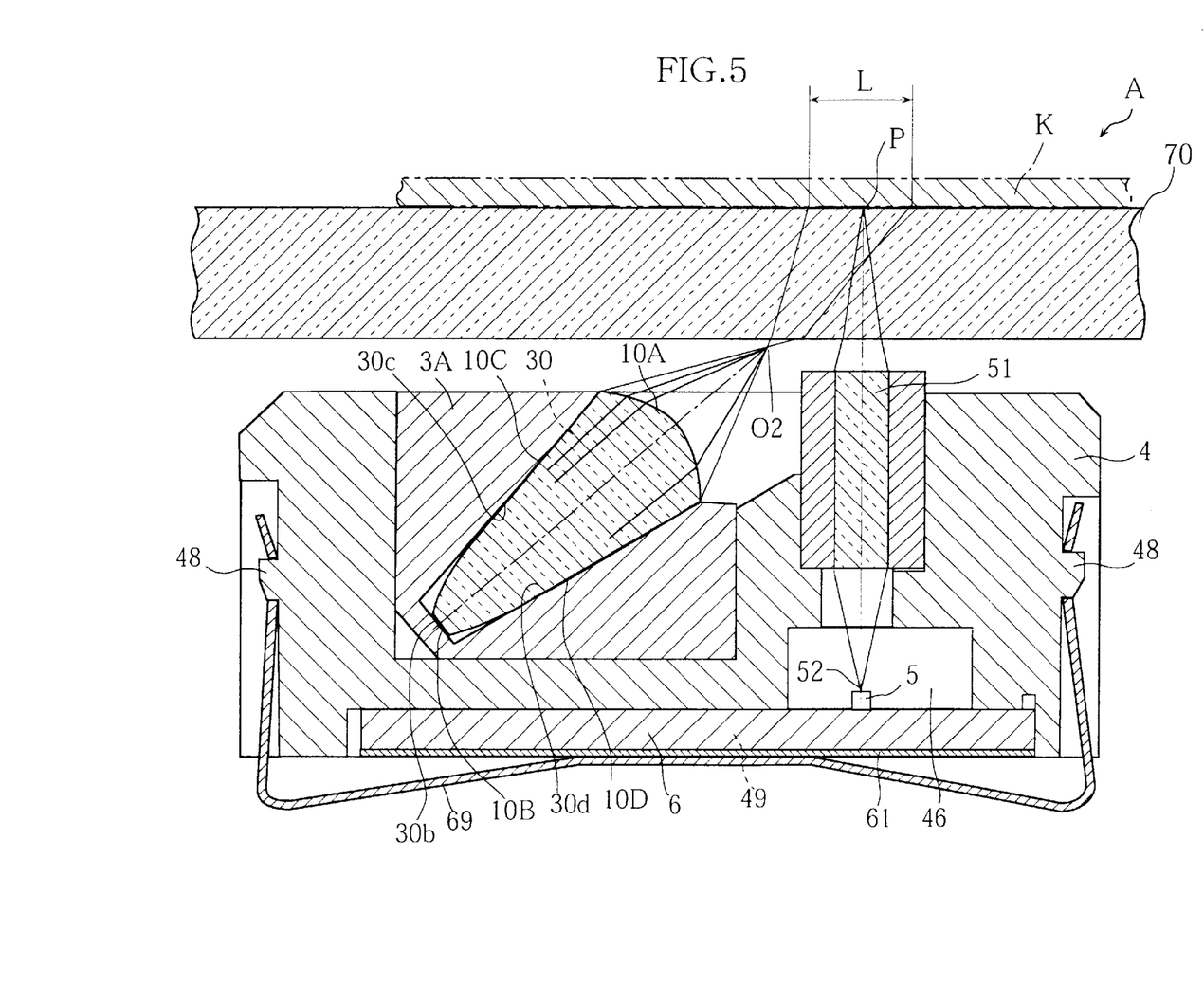
FIG. 5 is a sectional view taken along lines V—V in FIG. 4.
Figure 6:
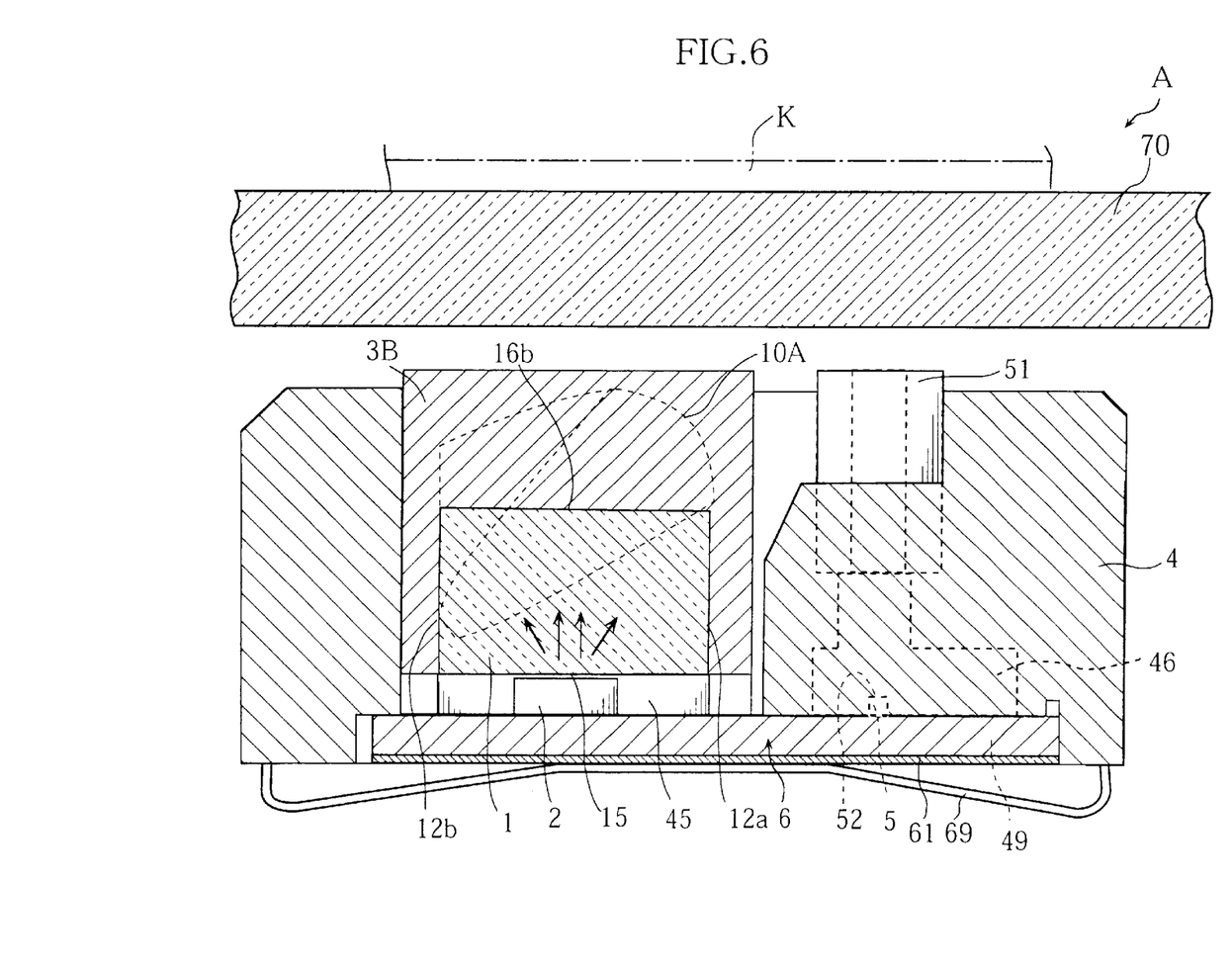
FIG. 6 is a sectional view taken along lines VI—VI in FIG. 4.
Figure 7:
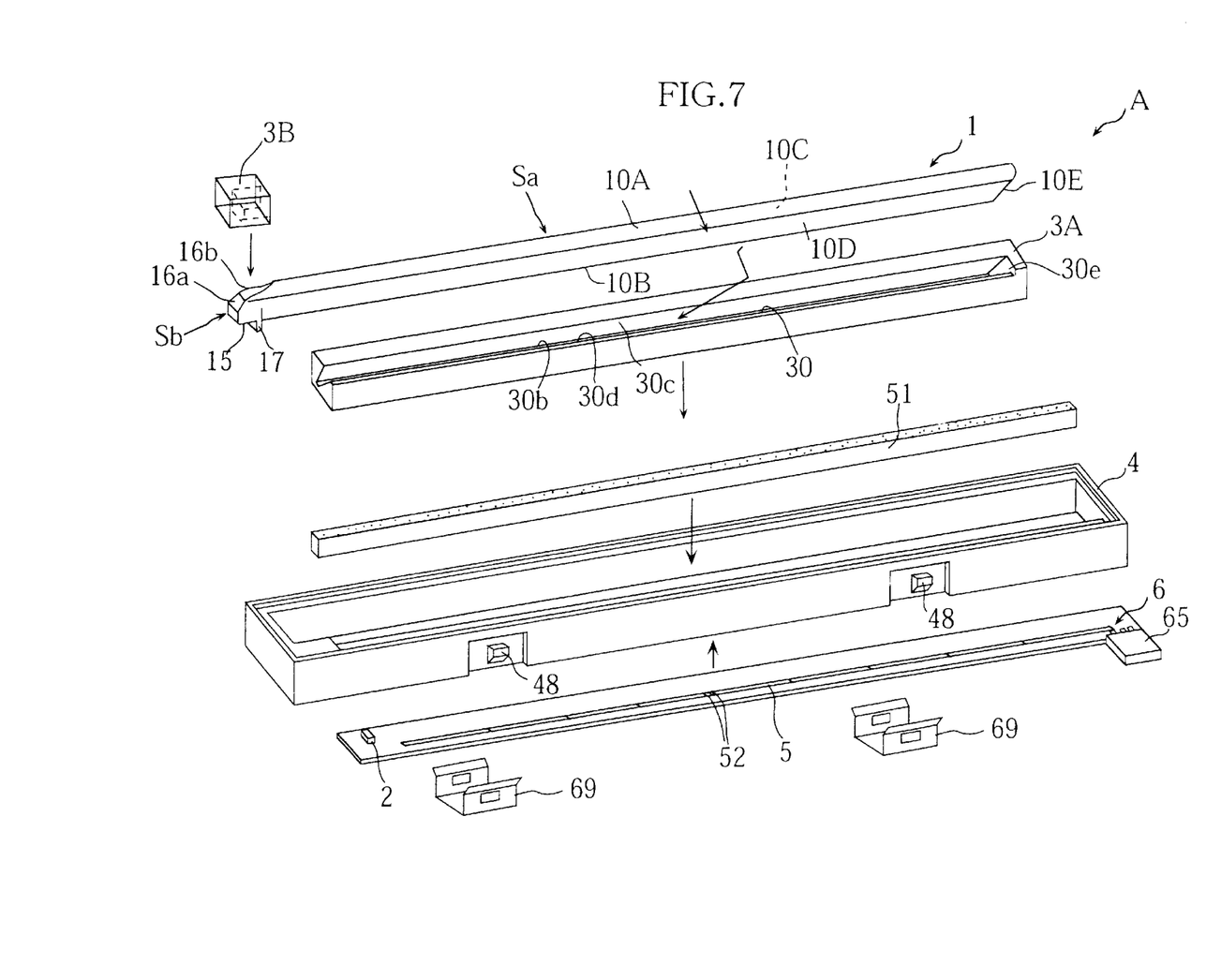
FIG. 7 is an exploded perspective view of the image sensor shown in FIG. 4.

As is clearly shown in FIGS. 5 and 6, the light guide 1 is accommodated in the casing 4 so that the first longitudinal surface 10A is directed toward the image-reading line P, whereas the light-incident portion 15 faces the light source 2. Accordingly, the light from the light source 2 is emitted, as a line or a band, toward the image-reading line P over the entire length of the first longitudinal surface 10A. At this time, since the light emitted through the first longitudinal surface 10A will not disperse in various directions, it is possible to effectively irradiate the image-reading line P within a predetermined width L. Further, since the light guide 1 propagates the light also in the longitudinal direction, it is possible to make the luminous intensity at the image reading line P substantially uniform along the length thereof.

The first reflector 3A functions also as a holder of the light guide 1. Specifically, as clearly shown in FIGS. 5 and 7, the first reflector 3A is formed with an upwardly open groove 30 having a generally V-shaped cross section. By fitting the primary section Sa into the groove 30, the light guide 1 is held by the first reflector 3A. The first reflector 3A is incorporated in the casing 4, thereby disposing the light guide 1 above the image sensor board 6.

The groove 30 includes inner walls 30b, 30c and 30d provided in facing relation to the second longitudinal surface 10B, the third longitudinal surface 10C and the fourth longitudinal surface 10D, respectively. The inner walls 30b–30d prevent the light from leaking through the longitudinal surfaces 10B–10D of the light guide 1. Further, as clearly shown in FIGS. 4 and 7, the groove 30 is provided with a planar reflective wall 30e at an end thereof. Accordingly, when the light propagating in the light guide 1 reaches the end surface 10E, it is reliably reflected by the reflective wall 30e. As a result, the light is prevented from leaking through the end surface 10E. The first reflector 3A maybe formed of a white synthetic resin for example. The inner walls 30b–30d and the reflective wall 30e are rendered smooth to have a high light reflectance.

The second reflector 3B covers the auxiliary section Sb of the light guide 1 to prevent the light from leaking through the auxiliary section Sb. As clearly shown in FIGS. 4 and 6, the second reflector 3B fits onto the auxiliary section 3b from above to cover the inclined surfaces 16a, 16b and the other outer surfaces. Similarly to the first reflector 3A, the second reflector 3B may be formed of a white synthetic resin for example, and the inner walls thereof which are brought into contact with the auxiliary section Sb are rendered smooth to have a high light reflectance.

As shown in FIG. 5, the focus lens 51 causes the light reflected by the document K on the document supporting panel 70 to focus at the light receiving elements 52. The focus lens 51 may comprise, for example, a multiplicity of selfoc lenses (self focusing lenses) arranged in an array extending in the direction of the image-reading line P (i.e., the primary scanning direction) for forming a non-magnified and non-inverted image of the document. Alternatively, an array of convex lenses may be employed. The focus lens 51 is mounted in the casing 4 at a location right above the plurality of light receiving elements 52 via the inner space 46.

Next, description is made as to the operation of the image sensor A for reading an image.

As shown in FIGS. 5 and 6, with the document K placed on the document supporting panel 70, light is emitted from the light source 2. The light enters the light guide 1 to propagate longitudinally therein while being allowed to go out over the entire length of the first longitudinal surface 10A. Thus, the light irradiates a surface of the document K as a line or a band extending in the primary scanning direction. The light reflected on the document K focuses, by passing through the focus lens 51, at the plurality of light receiving elements 52 each of which generates an image signal with an output level corresponding to the received amount of light. For reading a color image of the document, the light source 2 successively emits red, green and blue light for reflection on the document K. When the reflected light is received by each of the plural light receiving elements 52, an image signal is generated with respect to each of red, green and blue light.

In use of the image sensor A, another light source may be provided adjacent the casing 4 or natural light may enter the image sensor. As a result, the outer surfaces of the casing 4 and the reverse surface of the image sensor board 6 may be irradiated with various kinds of disturbing light coming from the outside. However, as described above, the light shielding layer 61 provided on the reverse surface of the image sensor board 6 blocks light over a wide range of wavelength. Accordingly, disturbing external light is reliably prevented from entering through the image sensor board 6 into the inner space 46 in which the light receiving elements 52 are disposed. Further, since the casing 4 itself is large in wall thickness and formed of a black synthetic resin, it also prevents penetration of disturbing external light. Therefore, it is possible to eliminate or reduce the possibility that the disturbing external light enters the inner space 46 to be unfavorably received by the light receiving elements 52. Thus, the light receiving elements 52 effectively receive only the light reflected by the document K. As a result, it is possible to obtain a clear image with reduced noises.

Figure 11:
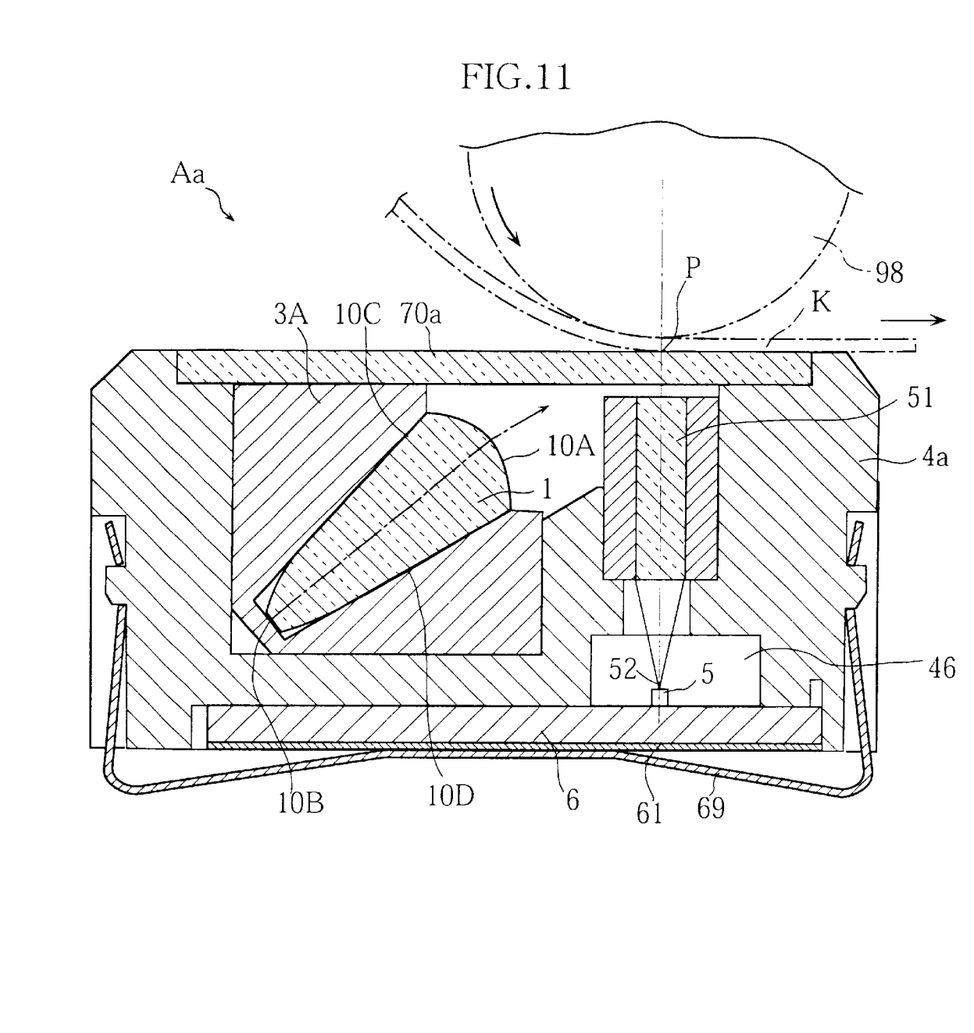
FIG. 11 is a sectional view showing another example of image sensor embodying the present invention.

FIG. 11 is a sectional view of another image sensor embodying the present invention. In FIG. 11 (and also in FIGS. 12 and 13), the portions which are identical or similar to those of the foregoing embodiment are designated by the same reference signs, and the explanation thereof will be omitted.

The image sensor Aa shown in FIG. 11 is a contact-type image sensor. The image sensor Aa has a structure basically similar to that of the image sensor A of the foregoing embodiment except that a document supporting panel 70a made of a transparent glass material for placing a document K is mounted to constitute an upper surface of a casing 4a. A platen roller 98 for transmitting the document K in the secondary scanning direction is provided in facing relation to the document supporting panel 70a. However, to constitute the image sensor Aa as a hand-held contact-type image scanner, the platen roller 98 is not provided, so that the casing 4a is manually carried by a user.

The contact-type image sensor Aa may incorporate an image sensor board 6 having a structure similar to that used in a flat-bed type image sensor. Therefore, it is possible to enjoy the advantages obtained by the provision of the light shielding layer 61 on the reverse surface of the image sensor 6.

Figure 12:
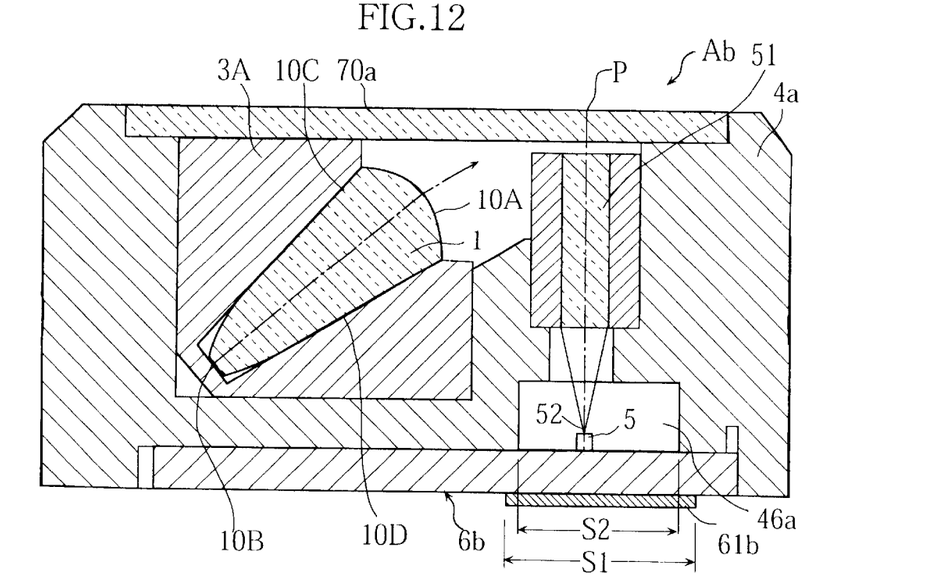
FIG. 12 is a sectional view showing a further example of image sensor embodying the present invention.
Figure 13:
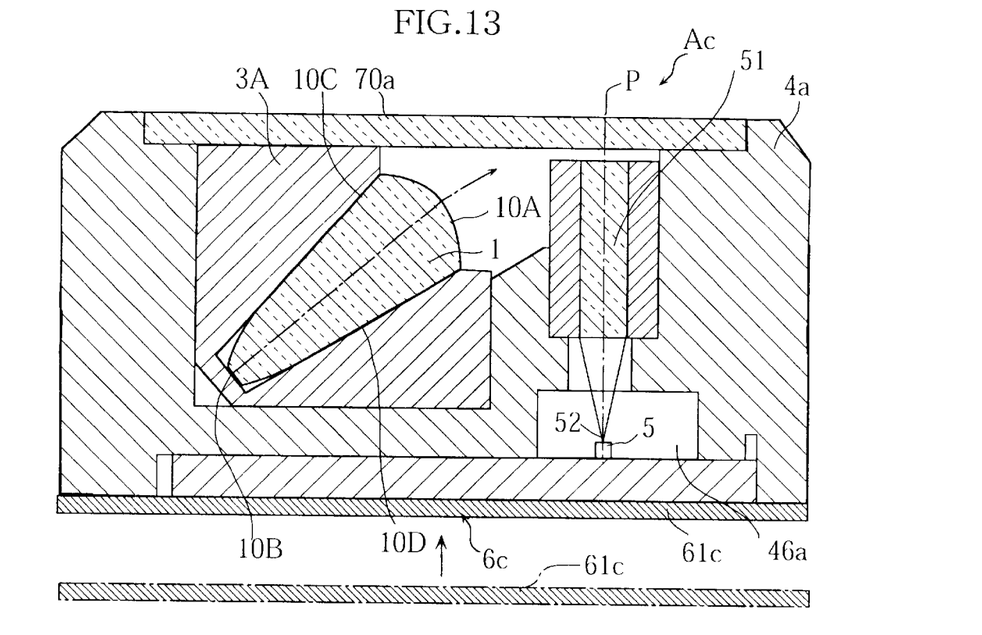
FIG. 13 is a sectional view showing still another example of image sensor embodying the present invention.

FIGS. 12 and 13 each is a sectional view of a further image sensor according to the present invention.

The image sensor Ab shown in FIG. 12 incorporates an image sensor board 6b partially provided with a light shielding layer 61b on the reverse surface thereof. Specifically, the light shielding layer 61b is provided only at a portion where a plurality of light receiving elements 52 are mounted. Preferably, the shielding layer 61b has a width S1 generally identical with or larger than the width S2 of the inner space 46a of the casing 4a accommodating the plurality of image sensor chips 51. With such a structure, the light shielding layer 61b blocks light over a wide range of wavelength, and hence, it is possible to reliably prevent disturbing external light from entering through the image sensor board 6b into the inner space 46a.

FIG. 13 shows an image sensor Ac wherein an image sensor board 6c has a reverse surface provided with a light shielding layer in the form of a tape strip 61c. Specifically, the tape strip 61c, which contains a black pigment to exhibit a high light shielding ability, is attached not only to the reverse surface of the image sensor board 6c but also to the bottom surface of the casing 4a. The tape strip 61c may be applied, on one surface, with an adhesive (sticky agent) in advance. The substrate of the tape strip 61 itself may contain a black pigment to exhibit a high light shielding ability. Alternatively, a coating containing a black pigment and having a high light shielding ability may be applied on one or both surfaces of a substrate which does not have a high light shielding ability.

With the structure shown in FIG. 13, entry of disturbing external light into the casing 4c is prevented (or decreased) by the tape strip (light shielding layer) 61c. Further, since the tape 61 fixes the image sensor board 6c to the casing 4c, it is possible to dispense with the attachment 69 employed in the foregoing embodiments. As a result, it is possible to advantageously facilitate fixing of the image sensor board 6c to the casing 4c and to reduce the manufacturing cost.

Although the light shielding layer provided in the image sensor shown in FIG. 13 comprises a tape strip 61c, a plate-like light shielding member, which is relatively hard with no flexibility, may be laminated on the reverse surface of the image sensor board substrate to work as a light shielding layer. Such a light shielding member may be adhesively bonded on the reverse surface of the substrate in lamination or held thereon by the use of an appropriate attachment.

Thus, in accordance with the present invention, a light shielding layer may be provided on the reverse surface of an image sensor board in various ways. Additional examples include applying, directly to the reverse surface of the board substrate, a coating material containing a black pigment and having a high light shielding ability. Further, use may be made of a black pigment other than a Fe—Cr—Co based black pigment or a Cu—Cr based black pigment.

Although various embodiments of the present invention have been described above, the present invention is not limited by these embodiments and may be modified in various ways. For instance, the substrate of the image sensor board may be made of a resin material instead of a ceramic material. Further, the light guide 1 may be dispensed with depending on the kind or location of the light source 2. Furthermore, as the light source 2, a cold cathode tube may be employed instead of LEDs.

What is claimed is:

1. An image sensor board comprising:
    a substrate made of a ceramic material and having an obverse surface provided with a plurality of light receiving elements for generating image signals upon receiving light; and
    a light shielding layer for covering a reverse surface of the substrate at least entirely over a portion of the obverse surface where the plurality of light receiving elements are mounted,
    wherein the light shielding layer is no greater in area than the reverse surface of the substrate.

2. The image sensor board according to claim 1, wherein the light shielding layer is black.

3. The image sensor board according to claim 2, wherein the light shielding layer contains a first black pigment which is Fe—Cr—Co based and a second black pigment which is Cu—Cr based.

4. The image sensor board according to claim 3, wherein the light shielding layer comprises a black glass material containing the first black pigment and the second black pigment in a total amount of 13–25 wt %.

5. The image sensor board according to claim 1, wherein the light shielding layer covers the entire reverse surface of the substate.

6. The image sensor board according to claim 1, wherein the light shielding layer comprises a light-shielding tape bonded to the reverse surface of the substate.

7. The image sensor board according to claim 1, wherein the light shielding layer is formed by applying, to the reverse surface of the substate, a coating material containing a black pigment.

8. An image sensor comprising:
    a casing;
    a light source disposed in the casing for emitting light toward an object to be read;
    an image sensor substrate having on an obverse surface provided with a plurality of light receiving elements for generating image signals upon receiving light reflected by the object, the image sensor substrate being disposed so that the obverse surface thereof is directed inwardly of the casing;
    wherein the substrate is covered with a light shielding layer for covering a reverse surface of the substrate where the plurality of light receiving elements are mounted, the light shielding layer being no greater in area than the reverse surface of the substrate.

9. The image sensor according to claim 8, wherein the light shielding layer is black.

10. The image sensor according to claim 9, wherein the light shielding layer contains a first black pigment which is Fe—Cr—Co based and a second black pigment which is Cu—Cr based.

11. The image sensor according to claim 10, wherein the light shielding layer comprises a black glass material containing the first black pigment and the second black pigment in a total amount of 13–25 wt %.

12. The image sensor according to claim 8, wherein the light shielding layer covers the entirety of the reverse surface of the substate.

13. The image sensor according to claim 8, wherein the light shielding layer is formed by applying, to the reverse surface of the substate, a coating material containing a black pigment.

14. An image sensor comprising:

a casing;

a light source disposed in the casing for emitting light toward an object to be read;

an image sensor substrate having on an obverse surface provided with a plurality of light receiving elements for generating image signals upon receiving light reflected by the object, the image sensor substrate being disposed so that the obverse surface thereof is directed inwardly of the casing; and a light shielding layer for covering a reverse surface of the substrate;

wherein the light shielding layer comprises a light-shielding tape bonded to the reverse surface of the substrate.

15. The image sensor according to claim 14, wherein the tape extends beyond the image sensor substrate to be bonded also to the casing.

* * * * *